United States Patent
Yeh et al.

(10) Patent No.: US 9,214,495 B1
(45) Date of Patent: Dec. 15, 2015

(54) MEMORY CELL STRUCTURE AND FORMATION METHOD THEREOF

(71) Applicant: Winbond Electronics Corp., Taichung (TW)

(72) Inventors: Jun-Lin Yeh, Zhubei (TW); Im-Cheol Ha, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/478,563

(22) Filed: Sep. 5, 2014

(51) Int. Cl.
  *H01L 27/088* (2006.01)
  *H01L 27/24* (2006.01)
  *H01L 23/528* (2006.01)
  *H01L 29/66* (2006.01)
  *H01L 45/00* (2006.01)
  *H01L 21/8234* (2006.01)

(52) U.S. Cl.
  CPC ........ *H01L 27/2436* (2013.01); *H01L 21/8234* (2013.01); *H01L 23/528* (2013.01); *H01L 29/66568* (2013.01); *H01L 45/16* (2013.01)

(58) Field of Classification Search
  CPC . H01L 27/088; H01L 27/228; H01L 27/2454; H01L 29/0649; H01L 29/4236; H01L 29/4958
  See application file for complete search history.

(56) References Cited

U.S. PATENT DOCUMENTS

2010/0254191 A1* 10/2010 Son ..................... H01L 27/0207
                                                  365/185.05

* cited by examiner

*Primary Examiner* — Kyoung Lee
(74) *Attorney, Agent, or Firm* — Muncy, Geissler, Olds & Lowe, P.C.

(57) ABSTRACT

A memory cell structure is provided. A first doping region is formed in a substrate. A second doping region is formed in the substrate. A first gate is formed on the substrate. The first and second doping regions and the first gate constitute a first transistor. A first word line is electrically connected to the first gate. The first word line firstly extends along a first direction and then along a second direction which is different from the first direction. A resistive layer is electrically connected to the first doping region. A conductive layer comprises a first source line and a bit line. The first source line is electrically connected to the second doping region, and the bit line is electrically connected to the resistive layer. The first and second doping regions extend along a third direction which is different from the first and second directions.

18 Claims, 7 Drawing Sheets

MEMORY CELL STRUCTURE AND FORMATION METHOD THEREOF

BACKGROUND OF THE INVENTION

1. Field of the Invention

The invention relates to a memory cell structure, and more particularly to the structure of a resistive RAM.

2. Description of the Related Art

Generally, there are two kinds of memory: non-volatile memory and volatile memory. The most common non-volatile memory is flash memory. However, flash memory utilizes high operation voltage and has low operation speed.

Many new materials and kinds of non-volatile memory are being developed. New kinds of non-volatile memories comprise Magnetic Random Access Memory (MRAM), Phase-Change Memory (PCM) and Resistive Random Access Memory (RRAM). The RRAM possesses the favorable advantages of having low power consumption, low operation voltage, a low erase time, high endurance, long storage time, an non-destructive read operation, various memory stages, a simple manufacturing process and reducible size. However, the yield rate and efficiency of the RRAM still need to be increased.

BRIEF SUMMARY OF THE INVENTION

In accordance with an embodiment, a cell structure comprises a substrate, a first doping region, a second doping region, a first gate, a first word line, a resistive layer and a conductive layer. The first doping region is formed in the substrate. The second doping region is formed in the substrate. The first gate is formed on the substrate. The first and second doping regions and the first gate constitute a first transistor. The first word line is electrically connected to the first gate. The first word line firstly extends along a first direction and then along a second direction which is different from the first direction. The resistive layer is electrically connected to the first doping region. The conductive layer comprises a first source line and a bit line. The first source line is electrically connected to the second doping region, and the bit line is electrically connected to the resistive layer. The first and second doping regions extend along a third direction which is different from the first and second directions.

An exemplary embodiment of a method for forming a memory cell comprises forming a first doping region and a second doping region in a substrate; forming a first gate on the substrate; constituting a first transistor by the first gate and the first and second doping regions; electrically connecting a first word line to the first gate, and the first word line firstly extends along a first direction and then along a second direction which is different from the first direction; and forming a resistive layer on the substrate. Wherein the resistive layer is electrically connected to the first doping region. Wherein the first and second doping regions extend along a third direction which is different from the first and second directions.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
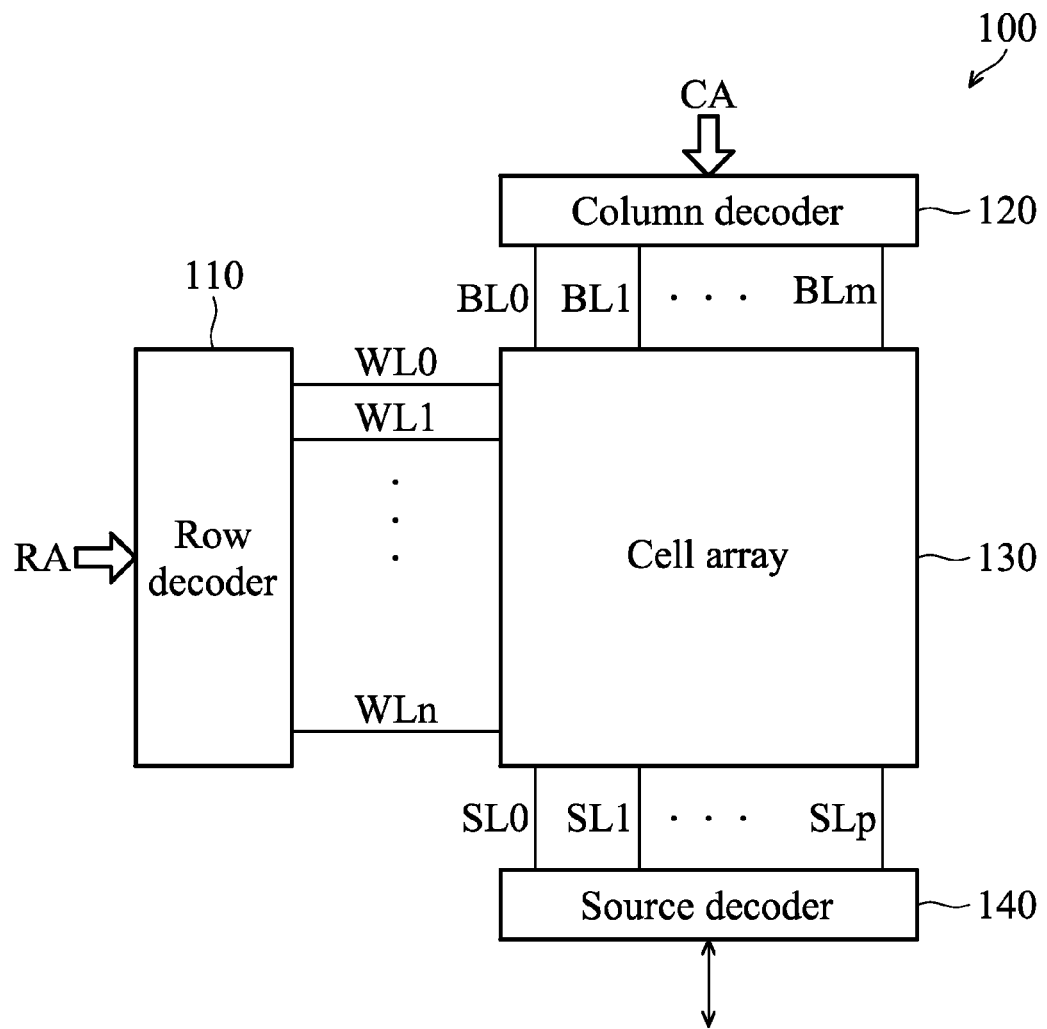
FIG. 1 is a schematic diagram of a memory device according to an embodiment of the present invention.

FIG. 1 is a schematic diagram of a memory device according to an embodiment of the present invention. The memory device 100 comprises a row decoder 110, a column decoder 120, a cell array 130 and a source decoder 140. In this embodiment, the memory device 100 is a resistive RAM (RRAM). The resistances of cells in the cell array 130 are set to write data into the cell array 130.

The row decoder 110 is coupled to the cell array 130 via the word lines WL0~WLn. The row decoder 110 decodes the row address RA and enables the corresponding word line according to the decoded result. In one embodiment, the row decoder 110 enables one of the word lines WL0~WLn. In some embodiments, the row decoder 110 simultaneously enables two neighboring word lines.

The column decoder 120 is coupled to the cell array 130 via the bit lines BL0~BLm. The column decoder 120 decodes the column address CA and enables the corresponding bit line according to the decoded result. In one embodiment, the column decoder 120 enables one of the bit lines BL0~BLm according to the column address CA.

The cell array 130 comprises a plurality of memory cells arranged in a matrix. The cell array operates in a write mode or in a read mode according to the levels of the word lines WL0~WLn and the bit lines BL0~BLm. In the write mode, the cell array 130 stores data of the source lines SL0~SLp. In the read mode, the cell array 130 provides the stored data to the source lines SL0~SLp. In this embodiment, the resistance of each memory cell in the cell array 130 represents the value of the data.

The source decoder 140 is coupled to the cell array 130 via the source lines SL0~SLp for retrieving the data stored in the cell array 130 or writing the data into the cell array 130. In one embodiment, the source decoder 140 reads the resistance of a memory cell via at least one source line. Since the structures of the memory cells in the cell array 130 are the same, in the following, only the electric circuit of one memory cell is described.

Figure 2:
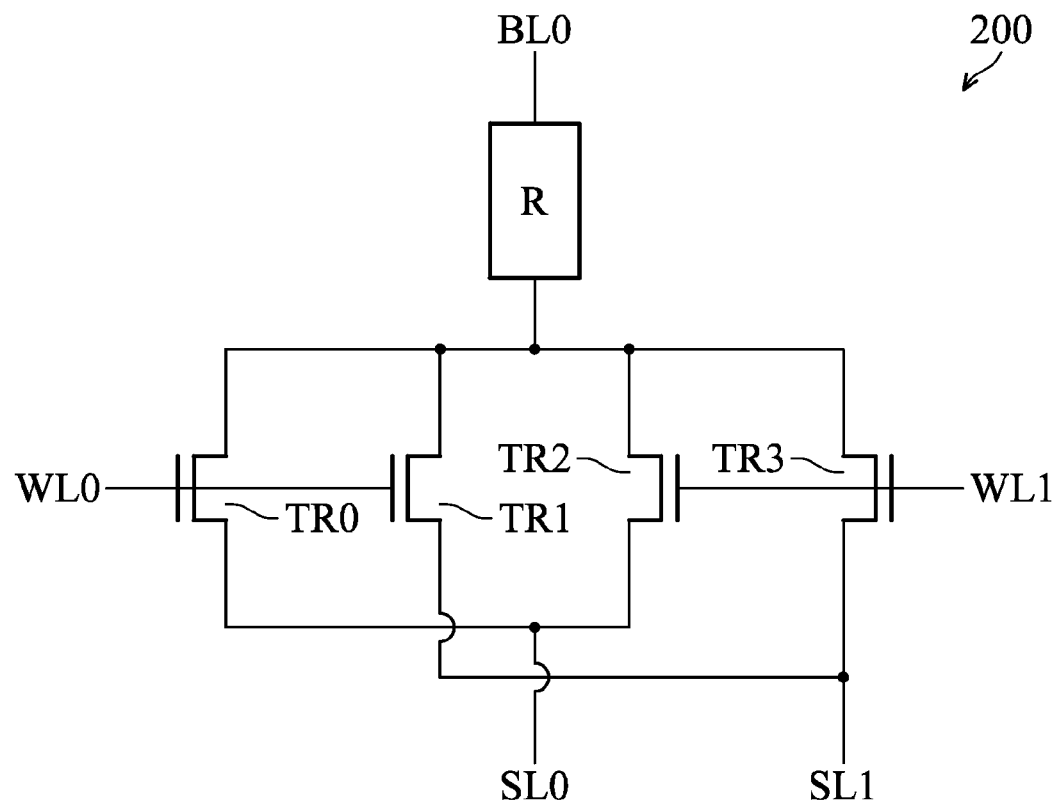
FIG. 2 is an equivalent circuit of a memory cell according to an embodiment of the present invention.

FIG. 2 is an equivalent circuit of a memory cell according to an embodiment of the present invention. The memory cell 200 comprises a resistor R and transistors TR0~TR3. The resistor R is coupled between the bit line BL0 and the transistors TR0~TR3. The voltage difference on the resistor R is controlled to adjust the resistance of the resistor R. In one embodiment, when the resistor R has a high resistance, it means that the value of data stored in memory cell 200 is 1.

Conversely, when the resistor R has a low resistance, it means that the value of data stored in memory cell 200 is 0.

In this embodiment, the transistors TR0~TR3 are N-type transistors, but the disclosure is not limited thereto. In some embodiments, at least one of transistors TR0~TR3 is a N-type or a P-type transistor. As shown in FIG. 2, the gates of the transistors TR0 and TR1 are coupled to the word line WL0, and the drains of the transistors TR0 and TR1 are coupled to the resistor R. The gates of the transistors TR2 and TR3 are coupled to the word line WL1, and the drains of the transistors TR2 and TR3 are coupled to the resistor R. The sources of the transistors TR0 and TR2 are coupled to the source line SL0. The sources of the transistors TR1 and TR3 are coupled to the source line SL1.

In this embodiment, the transistors TR0~TR3 are turned on by controlling the levels of the word lines WL1 and WL0. The levels of the bit line BL0 and the source lines SL0 and SL1 are controlled to execute different operations for the resistor R. For example, a forming operation, a set operation, a reset operation, a read operation or a write operation is executed on the memory cell 200.

The invention does not limit the numbers of the word line and source line coupled to the same memory cell. In this embodiment, the memory cell 200 comprises two word lines and two source lines. In another embodiment, the memory cell 200 comprises a single word line and two source lines, or, it comprises two word lines and a single source line. In other embodiments, the memory cell 200 may comprise a single word line and a single source line.

In this embodiment, since the memory cell 200 is coupled to two word lines and two source lines, the memory cell 200 comprises four transistors. In another embodiment, when the memory cell 200 only comprises a single word line (e.g. the word line WL0) and two source lines, two transistors (e.g. TR0 and TR1) are formed in the memory cell 200. Similarly, if the memory cell 200 comprises two word lines and a single source line (e.g. SL0), the memory cell 200 comprises two transistors (e.g. TR0 and TR2). In other embodiments, if the memory cell 200 comprises a single word line (e.g. WL0) and a single source line (e.g. SL0), the memory cell 200 comprises a single transistor (e.g. TR0). Therefore, the number of transistors in the memory cell 200 is determined according to the number of the word lines and the source lines.

Figure 3:
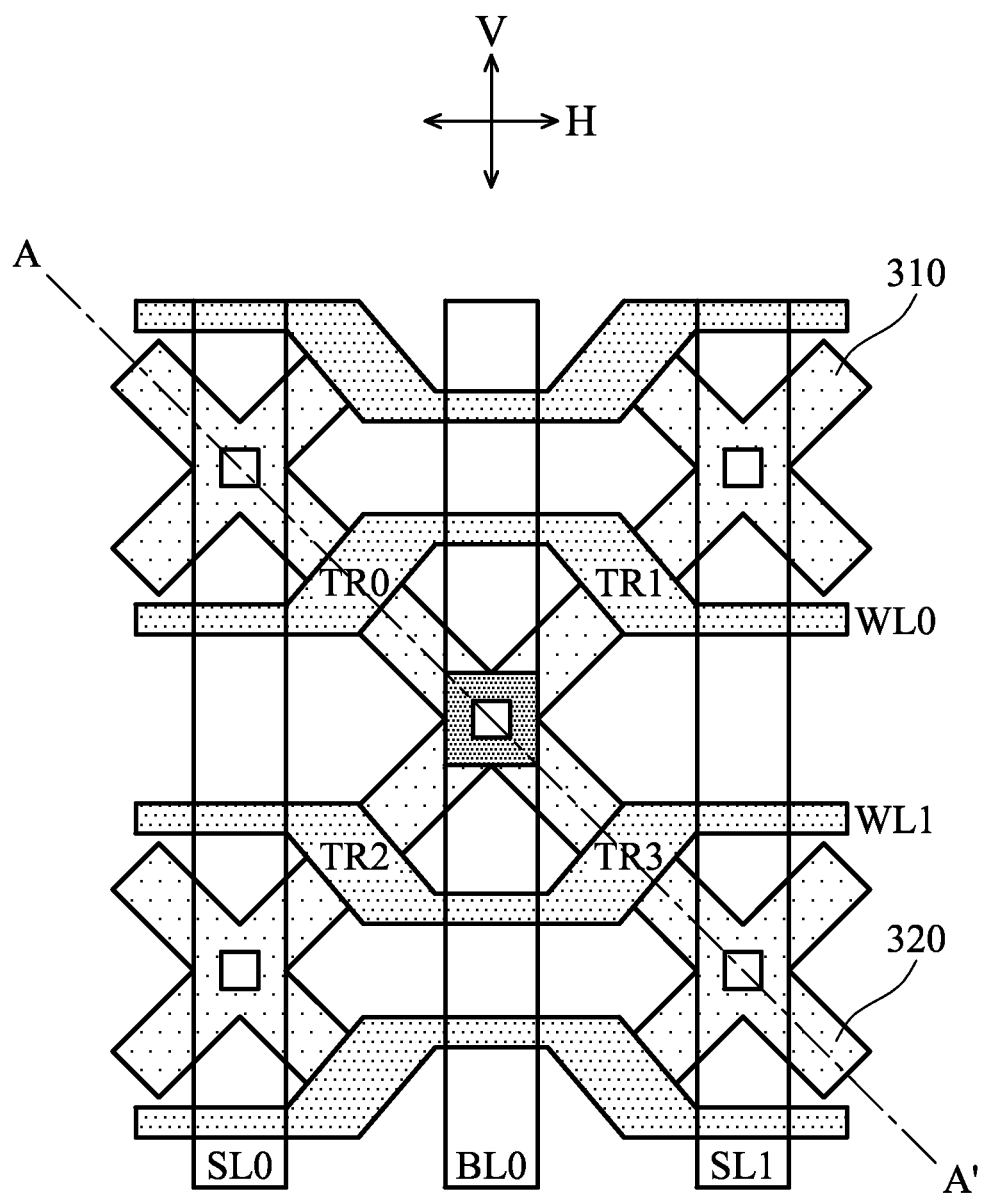
FIG. 3 is a plan view diagram of a memory cell according to an embodiment of the present invention.

FIG. 3 is a plan view diagram of a memory cell according to an embodiment of the present invention. The bit line BL0 is disposed between the source lines SL0 and SL1 and extended along the direction V. In this embodiment, the direction V is a vertical direction, and the direction H is a horizontal direction. Additionally, the active areas (AA) 310 and 320 are arranged into an X shape. The active area 310 is the channel area of the transistors TR1 and TR2, and the active area 320 is the channel area of the transistors TR0 and TR3.

As shown in FIG. 3, the word lines WL0 and WL1 are not extended straight along the direction H. In this embodiment, the word lines WL0 and WL1 are crookedly extended along the direction H. In addition, the bit line BL does not continuously overlap the active areas 310 and 320. In this embodiment, only a portion of the bit line BL overlaps the interlaced region of the active areas 310 and 320.

Figure 4A:
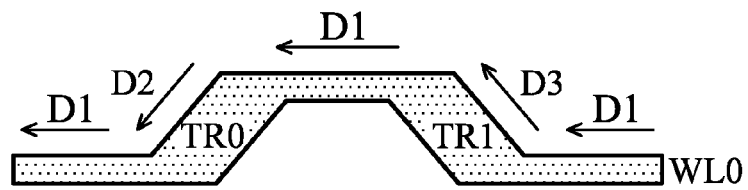
FIG. 4a is a schematic diagram of the word line of FIG. 3.
Figure 4A:
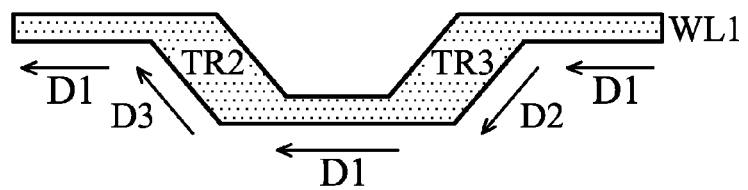
Figure 4B:
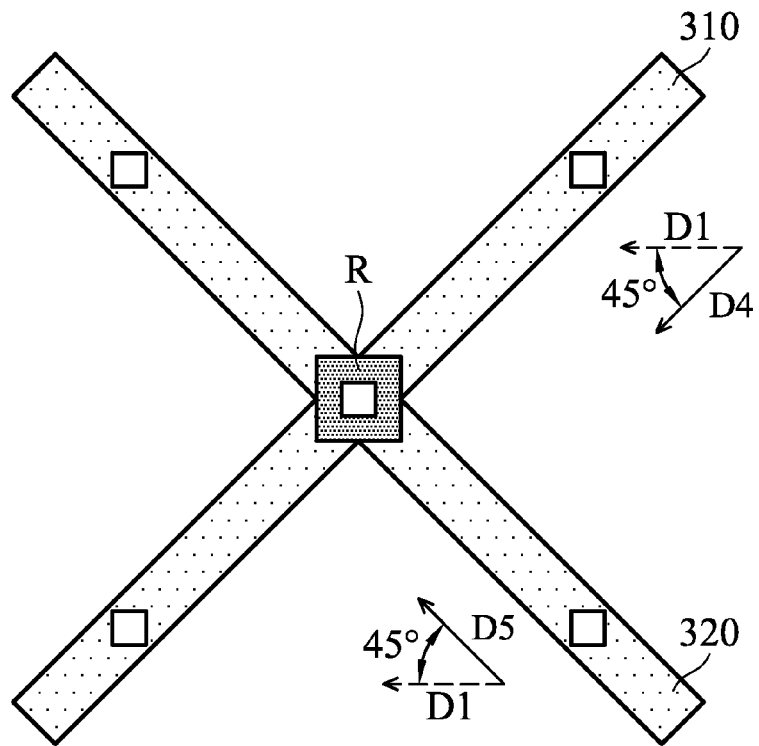
FIG. 4b is a schematic diagram of the active area of FIG. 3.

For clarity, only the word lines WL0 and WL1 in FIG. 3 are shown in FIG. 4a, and only the active areas 310 and 320 in FIG. 3 are shown in FIG. 4b. Refer to FIG. 4a, the word line WL0 firstly extends along the direction D1, then along the direction D3, then along the direction D1, then along the direction D2, and then along the direction D1. Furthermore, the word line WL1 firstly extends along the direction D1, then along the direction D2, then along the direction D1, then along the direction D3 and, then along the direction D1.

In this embodiment, the direction sequences of two neighboring word lines are different from each other. For example, the direction sequence of the word line WL1 is D1, D2, D1, D3 and D1, and the direction sequence of the word line WL0 is D1, D3, D1, D2 and D1. In some embodiments, the direction sequences of two neighboring word lines may be the same. Additionally, the directions D1~D3 are different in this embodiment. In one embodiment, the direction D1 is the same as the direction H shown in FIG. 3 and perpendicular to the direction V shown in FIG. 3.

Furthermore, when the word line extends along direction D2 or D3, the region in which the word line overlaps the active area 310 or 320 forms a transistor. Taking FIG. 3 as an example, when the word line WL0 is extended along the direction D3, the word line WL0 overlaps the active area 310. Therefore, the region in which the word line WL0 overlaps the active area 310 forms the transistor TR1. Similarly, the region that the word line WL0 overlaps the active area 320 forms the transistor TR0. The region that the word line WL1 overlaps the active area 310 forms the transistor TR2. The region that the word line WL1 overlaps the active area 320 forms the transistor TR3.

In some embodiments, when the memory cell is designed to comprise a single transistor (e.g. TR0), a source line (e.g. SL1) and a word line (e.g. WL1) can be omitted. If the memory cell is designed to comprise two transistors (e.g. TR0 and TR2), a source line (e.g. SL1) can be omitted. If the memory cell is designed to comprise two transistors (e.g. TR0 and TR1), a word line (e.g. WL1) can be omitted.

Refer to FIG. 4b, the active areas 310 and 320 are arranged into an X shape. In this embodiment, the active area 310 or 320 serves as a drain or a source of a transistor. As shown in FIG. 4b, the active area 310 is extended along the direction D4, and the active area 320 is extended along the direction D5. In one embodiment, the direction D4 is the same as the direction D2, and the direction D5 is the same as the direction D3. In other embodiments, the included angle between the directions D1 and D4 does not exceed 90 degrees. Similarly, the included angle between the directions D1 and D5 does not exceed 90 degrees. In one embodiment, the included angle between the directions D1 and D4 is 45 degrees, and the included angle between the directions D1 and D5 is also 45 degrees. Since the included angle between the directions D1 and D4 does not exceed 90 degrees, each channel of the transistors TR0~TR3 has a longest width. Therefore, the efficiency of each transistor is increased.

Figure 5:
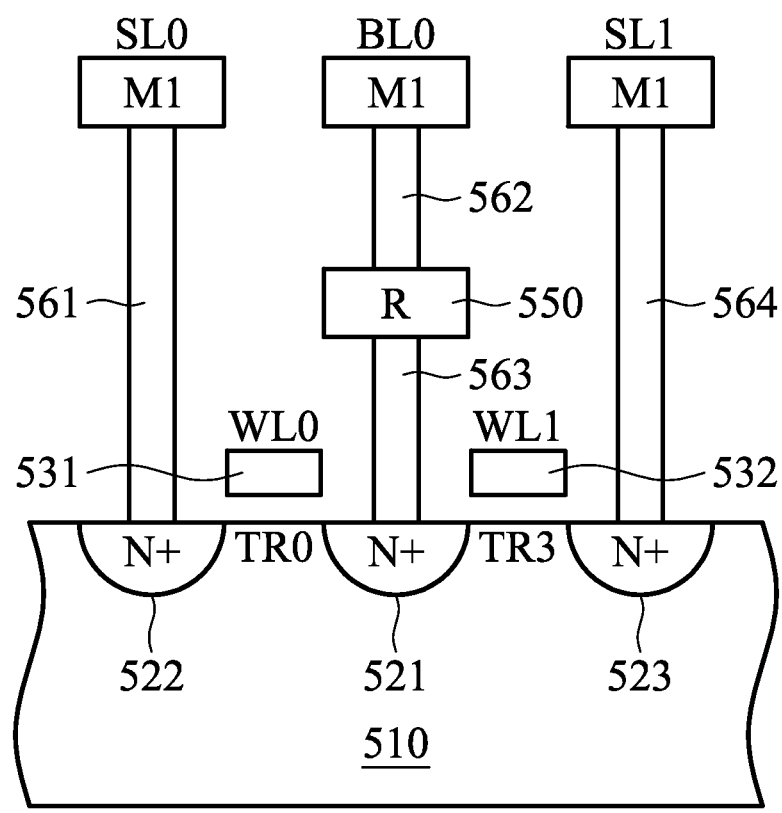
FIG. 5 is a cross-sectional view taken along line A-A' in FIG. 3.

FIG. 5 is a cross-sectional view taken along line A-A' in FIG. 3. As shown in FIG. 5, the doping regions 521~523 are formed in the substrate 510. The gates 531 and 532 are formed on the substrate 510. The word line WL0 is electrically connected to the gate 531. The word line WL1 is electrically connected to the gate 532. In this embodiment, the gate 531 and the doping regions 521 and 522 constitute the transistor TR0, and the gate 532 and the doping regions 521 and 523 constitute the transistor TR3. Refer to FIG. 3, the doping regions 521~523 constitute the active area 320. Refer to FIG. 4b, the doping regions 521~523 are extended along the direction D5.

The resistive layer 550 is electrically connected to the doping region 521. In one embodiment, the resistive layer 550 is connected to the doping region 521 via the plug 563. In this embodiment, the resistive layer 550 has a resistor R. The levels of the bit line BL0 and the doping region 521 are controlled to adjust the resistor R.

The conductive layer M1 comprises the source lines SL0 and SL1 and the bit line BL0. The source lines SL0 and SL1 and the bit line BL0 are independent of each other. In this embodiment, the source line SL0 is electrically connected to the doping region 522 via the plug 561, the bit line BL0 is electrically connected to the resistive layer 550 via the via 562, and the source line SL1 is electrically connected to the doping region 523 via the plug 564.

Figure 6:
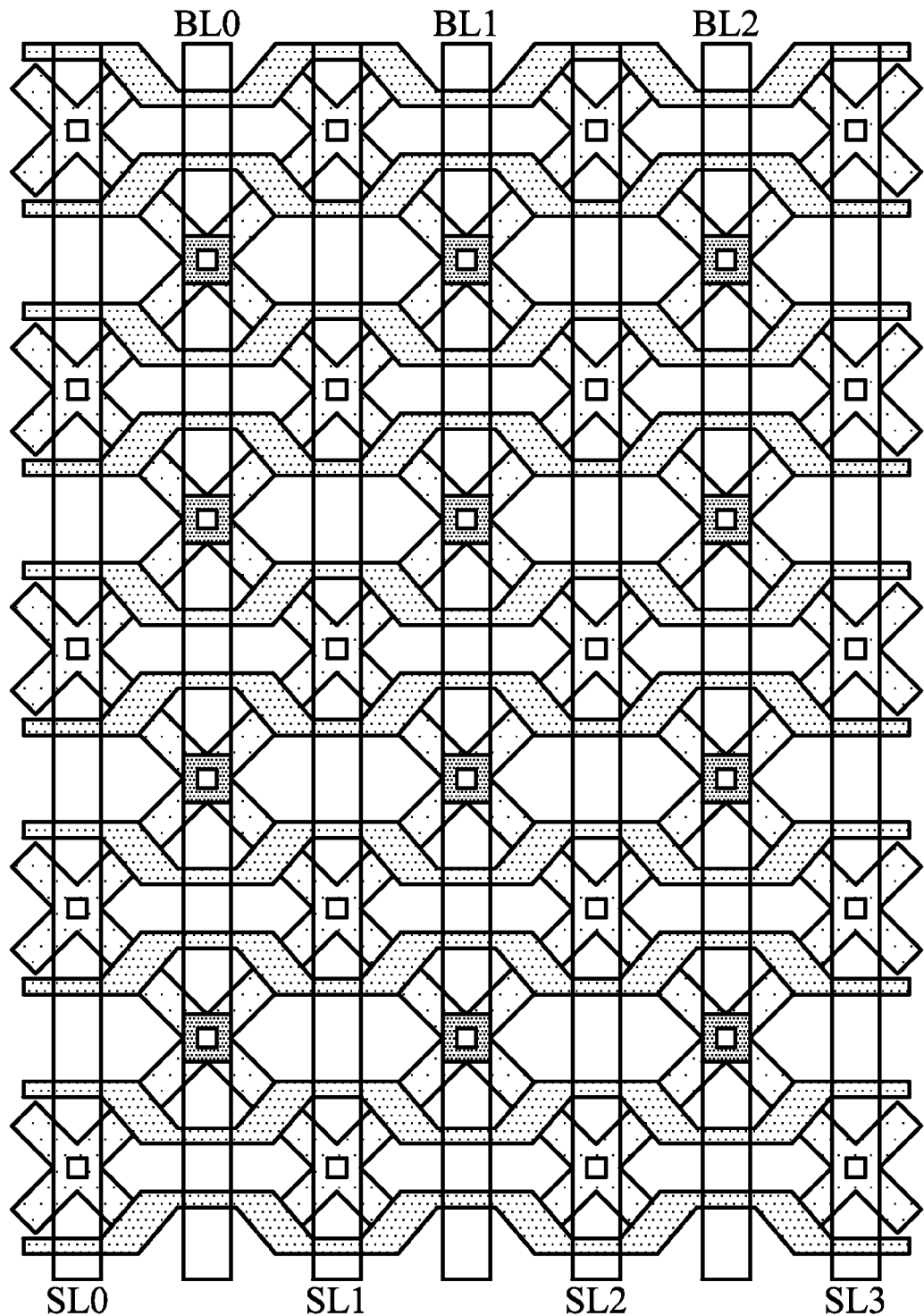
FIG. 6 is a plan view of a cell array according to an embodiment of the present invention.

FIG. 6 is a plan view of a cell array according to an embodiment of the present invention. The bit lines BL0~BL2 are parallel with the source lines SL0~SL3, and each of the bit lines BL0~BL2 is disposed between two source lines. Since the word lines are crookedly extended, the channel width and the efficiency of each transistor are increased.

Figure 7:
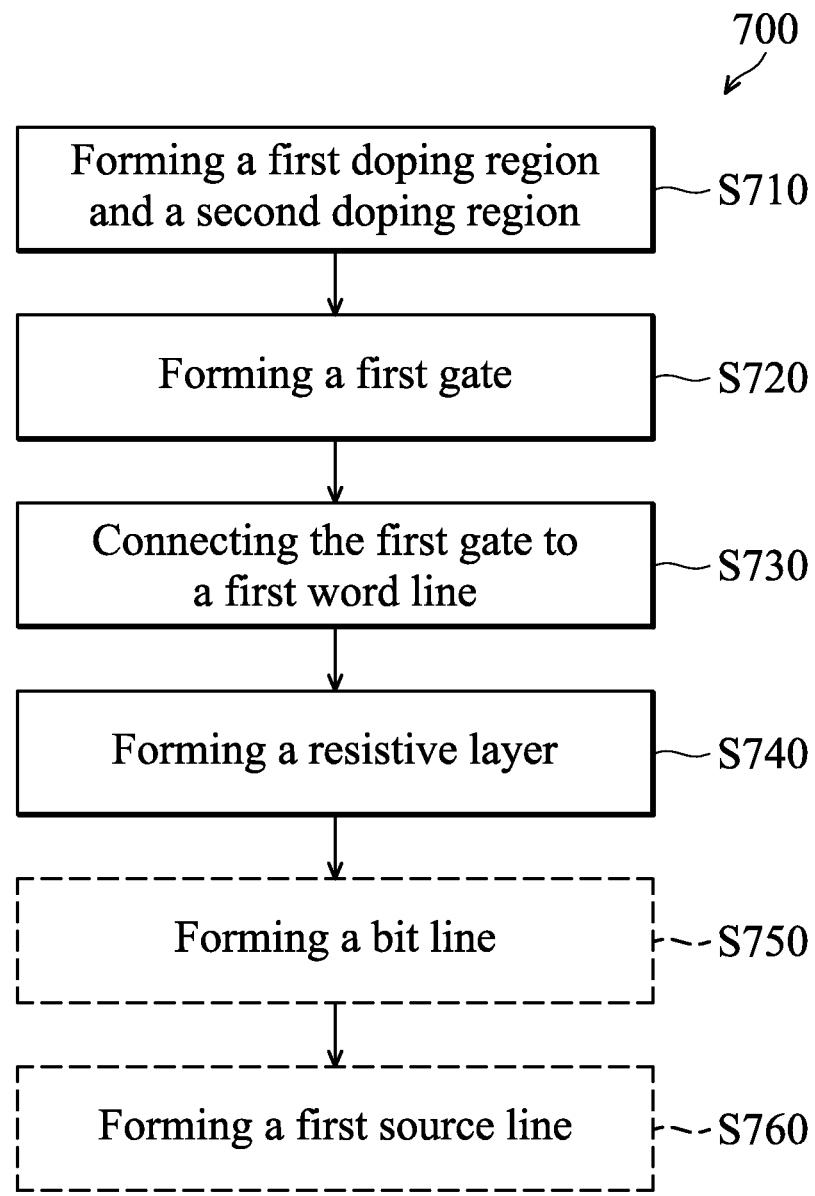
FIG. 7 is a flowchart diagram of a formation method according to an embodiment of the present invention.

FIG. 7 is a flowchart diagram of a formation method according to an embodiment of the present invention. The formation method is utilized to form a resistive memory cell. Firstly, a first doping region and a second doping region are formed in a substrate (step S710). Then, a first gate is formed on the substrate (step S720). In this embodiment, the first gate and the first and second doping regions constitute a first transistor.

In other embodiments, step S710 is performed to form a third doping region in the substrate, and step S720 is performed to form a second gate on the substrate. Therefore, the second gate and the first and third doping regions constitute a second transistor.

The first gate is electrically connected to a first word line (step S730). In this embodiment, the first word line is firstly extended along a first direction, such as the direction D1 shown in FIG. 4*a*, and then along a second direction, such as the direction D3 shown in FIG. 4*a*. In this embodiment, the first direction is different from the second direction. In one embodiment, the first direction is a horizontal direction, and the second direction is not the horizontal direction.

In some embodiments, the first and second doping regions are extended along a third direction, such as the direction D5 shown in FIG. 4*b*. The third direction is different from the first and second directions. In one embodiment, the included angle between the first and third directions does not exceed 90 degrees. For example, the included angle between the first and third directions is 45 degrees.

In another embodiment, after extending along a second direction (e.g. D3 in FIG. 4*a*), the first word line is firstly extended along the first direction and then along a fourth direction (e.g. D2 in FIG. 4*a*). Furthermore, step S730 is further electrically connected to a second word line and the second gate in some embodiments. In one embodiment, the second word line is extended along the first direction, then along the fourth direction (e.g. D2 in FIG. 4*a*), then along the first direction and then along the second direction.

Next, a resistive layer is formed on the substrate (step S740). In this embodiment, the resistive layer is electrically connected to the first doping region. The voltage provided to the resistive layer can be controlled to change the resistance of the resistive layer. In one embodiment, when the resistive layer has a high resistance, it means that the memory cell stores data 1. Conversely, when the resistive layer has a low resistance, it means that the memory cell stores data 0.

In some embodiments, the formation method 700 comprises step S750 (to form a bit line on the substrate). In one embodiment, the bit line is electrically connected to the resistive layer. In this embodiment, the bit line comprises a first segment and a second segment. The first segment overlaps the first doping region, and the second segment does not overlap the first doping region. In other words, the bit line does not continuously overlap the first doping region.

In another embodiment, the formation method 700 further comprises step S760 (to form a first source line). In this embodiment, the first source line and the bit line are extended along a fifth direction, such as the direction V in FIG. 3. In one embodiment, the fifth direction is perpendicular to the first direction. In some embodiment, step S760 further comprises the step of forming a second source line. In one embodiment, the second source line is electrically connected to the third doping region. In another embodiment, the bit line formed by step S750 is disposed between the first and second source lines.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory cell structure, comprising:
   a substrate;
   a first doping region formed in the substrate;
   a second doping region formed in the substrate;
   a first gate formed on the substrate, wherein the first and second doping regions and the first gate constitute a first transistor;
   a first word line electrically connected to the first gate, wherein the first word line extends firstly along a first direction and then along a second direction which is different from the first direction;
   a resistive layer electrically connected to the first doping region; and
   a conductive layer comprising a first source line and a bit line,
   wherein the first source line is electrically connected to the second doping region and the bit line is electrically connected to the resistive layer; and
   wherein the first and second doping regions extend along a third direction which is different from the first and second directions.

2. The memory cell structure as claimed in claim 1, wherein an included angle between the first and third direction does not exceed 90 degrees.

3. The memory cell structure as claimed in claim 2, wherein the included angle is 45 degrees.

4. The memory cell structure as claimed in claim 1, wherein the bit line comprises a first segment and a second segment, the first segment overlaps the first doping region, and the second segment does not overlap the first doping region.

5. The memory cell structure as claimed in claim 1, wherein after extending along the second direction, the first word line extends along the first direction and then along a fourth direction.

6. The memory cell structure as claimed in claim 5, wherein the first, second, and fourth directions are different from each other.

7. The memory cell structure as claimed in claim 6, wherein the first source line and the bit line extend along a fifth direction vertical to the first direction.

8. The memory cell structure as claimed in claim 7, further comprising:
   a third doping region formed in the substrate;
   a second gate formed on the substrate, wherein the second gate and the first and third doping regions constitute a second transistor; and
   a second word line electrically connected to the second gate, wherein the conductive layer further comprises a second source line electrically connecting to the third doping region, and the bit line is disposed between the first and second source lines.

9. The memory cell structure as claimed in claim 8, wherein the second word line firstly extends along the first direction, then along the fourth direction, then along the first direction and then along the second direction.

10. A method for forming a memory cell, comprising:
   forming a first doping region and a second doping region in a substrate;
   forming a first gate on the substrate, wherein the first gate and the first and second doping regions constitute a first transistor;
   electrically connecting a first word line and the first gate, wherein the first word line firstly extends along a first direction and then along a second direction which is different from the first direction; and
   forming a resistive layer on the substrate, wherein the resistive layer is electrically connected to the first doping region,
   wherein the first and second doping regions extend along a third direction which is different from the first and second directions.

11. The method as claimed in claim 10, wherein an included angle between the first and third direction does not exceed 90 degrees.

12. The method as claimed in claim 11, wherein the included angle is 45 degrees.

13. The method as claimed in claim 10, further comprising:
   forming a bit line electrically connected to the resistive layer, wherein the bit line comprises a first segment and a second segment, the first segment overlaps the first doping region, and the second segment does not overlap the first doping region.

14. The method as claimed in claim 13, further comprising:
   forming a first source line; and
   extending the first source line and the bit line along a fourth direction perpendicular to the first direction.

15. The method as claimed in claim 14, further comprising:
   forming a third doping region in the substrate;
   forming a second gate on the substrate, wherein the second gate, the first and third doping region constitute a second transistor;
   electrically connecting a second word line and the second gate; and
   electrically connecting a second source line and the third doping region, wherein the bit line is disposed between the first and second source lines.

16. The method as claimed in claim 15, wherein the second word line firstly extends along the first direction, then along a fifth direction, then along the first direction and then along the second direction.

17. The method as claimed in claim 16, wherein after extending along the second direction, the first word line is extended along the second direction, then along the first direction and then along the fifth direction.

18. The method as claimed in claim 10, wherein the first, second and fifth directions are different from each other.

* * * * *